United States Patent
Matsumura et al.

(10) Patent No.: US 6,891,198 B2
(45) Date of Patent: May 10, 2005

(54) FILM CARRIER TAPE FOR MOUNTING AN ELECTRONIC PART

(75) Inventors: Yasunori Matsumura, Ageo (JP); Hideaki Makita, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 0 days.

(21) Appl. No.: 10/600,980

(22) Filed: Jun. 20, 2003

(65) Prior Publication Data

US 2004/0086739 A1 May 6, 2004

(30) Foreign Application Priority Data

Jun. 20, 2002 (JP) ........................................ 2002-180270

(51) Int. Cl.[7] ............................................. H01L 29/267
(52) U.S. Cl. ........................... 257/81; 257/99; 257/666; 257/677; 257/781; 257/784
(58) Field of Search ................... 257/81, 99, 666–677, 257/779–784

(56) References Cited

U.S. PATENT DOCUMENTS

| | | | | |
|---|---|---|---|---|
| 5,120,665 A | * | 6/1992 | Tsukagoshi et al. | 156/64 |
| 5,821,627 A | * | 10/1998 | Mori et al. | 257/780 |
| 5,990,546 A | * | 11/1999 | Igarashi et al. | 257/700 |
| 6,211,052 B1 | * | 4/2001 | Farnworth | 438/614 |

FOREIGN PATENT DOCUMENTS

| | | |
|---|---|---|
| JP | 10-084064 A | 3/1998 |
| JP | 10-303254 A | 11/1998 |
| JP | 11-102939 A | 4/1999 |
| JP | 11-111782 A | 4/1999 |

* cited by examiner

*Primary Examiner*—David Nelms
*Assistant Examiner*—Long Tran
(74) *Attorney, Agent, or Firm*—Webb Ziesenheim Logsdon Orkin & Hanson, P.C.

(57) ABSTRACT

A film carrier tape for mounting an electronic part comprising an insulating film and a wire pattern which is made of a conductive metal and is provided on the surface of the insulating film, wherein an undercoating layer containing nickel as a main constituent is formed on at least a part of the surface of the wiring pattern made of a conductive metal, an intermediate layer containing palladium as a main constituent is formed on the surface of he undercoating layer, a surface layer containing gold as a main constituent is formed on the surface of the intermediate layer, and the average thickness of the intermediate layer containing palladium as a main constituent is not more than 0.04 μm.

8 Claims, 3 Drawing Sheets

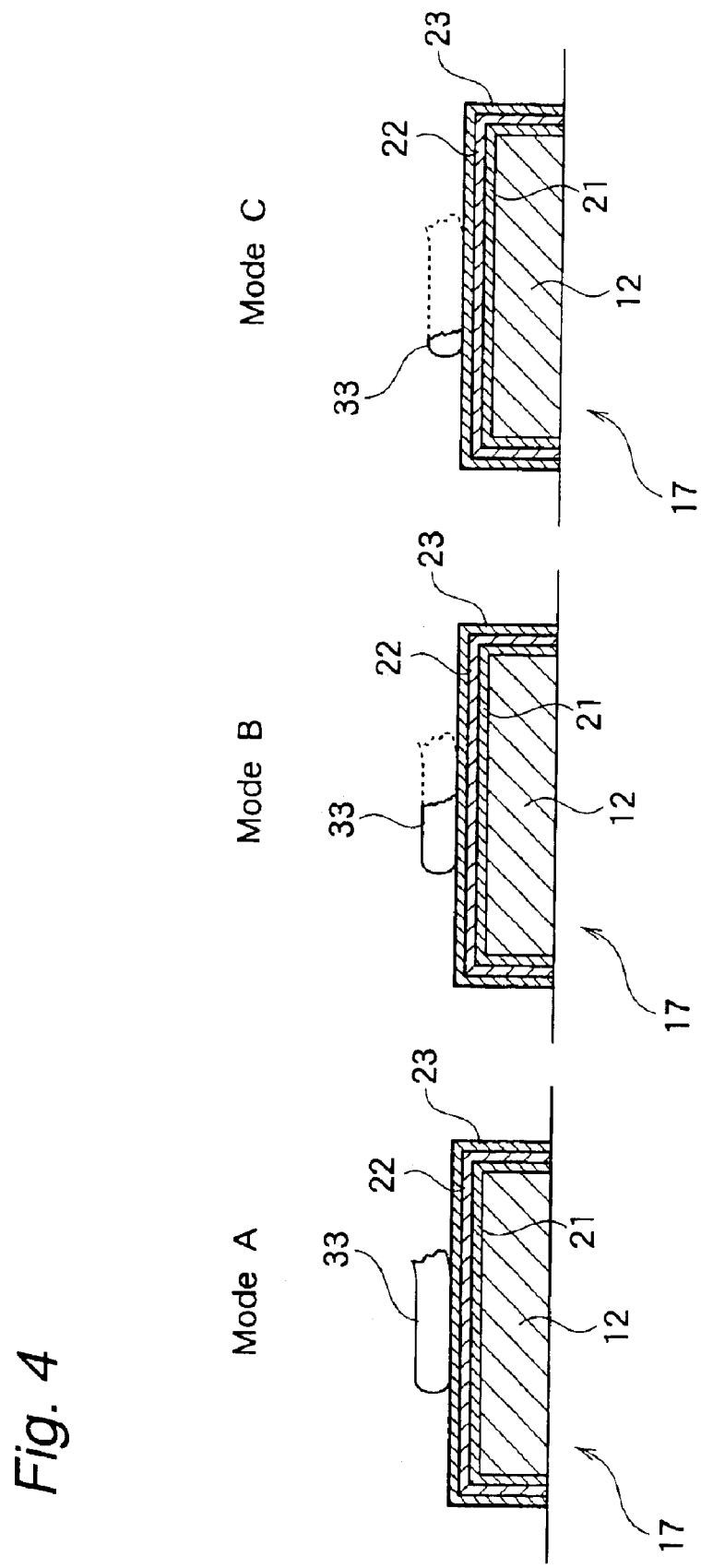

FILM CARRIER TAPE FOR MOUNTING AN ELECTRONIC PART

BACKGROUND OF THE INVENTION

The present invention relates to film carrier tapes for mounting electronic part, which have high reliability in the bonding of electronic parts to be mounted and whose outer connecting terminals, such as solder balls, also have high connection reliability. In the present invention, the film carrier tapes for mounting electronic part include those for TAB (tape automated bonding) method, COF (chip on film) method, CSP (chip size package) method, BGA (ball grid array) method, double-sided metal tape method, multi-layer wiring tape method, wire bonding method and flip chip bonding method.

DESCRIPTION OF THE RELATED ART

As methods to mount electronic parts such as IC on film carriers having wiring patterns formed thereon, there are known, for example, TAB (tape automated bonding) method, wire bonding method and flip chip bonding method. As the electronic parts have been more highly integrated and more densely mounted in recent years, film carrier tapes for mounting electronic part capable of high-dense mounting, such as CSP (chip size package), COF (chip on film) and BGA (ball grid array), have been employed. In such CSP, COF, BGA and TAB, wire bonding using gold wire is often adopted for bonding between the electronic part and the film carrier.

For conducting the wire bonding using gold wire, at the lead (bonding pad (connecting terminal)) section of the film carrier to which the gold wire is to be bonded, a nickel plated layer is formed on the surface of the lead made of a conductive metal, and on the nickel plated layer, a gold plated layer is further formed. The nickel plated layer is not only a layer to prevent diffusion of copper that forms a wiring pattern but also a layer to cut off ultrasonic wave used in the bonding of the gold wire. The gold plated layer is a layer to which the gold wire is bonded, and in order to conduct bonding of the gold wire, the gold plated layer is preferably thick.

On the film carriers such as CSP, COF, BGA and TAB, a solder ball is disposed as an output terminal, and this solder ball is electrically connected to a ball pad of the wiring pattern. The solder ball can be disposed on the ball pad of the wiring pattern more stably as the amount of the gold interposed becomes smaller.

In the production of the film carrier tape for mounting electronic part, however, the plated layer is generally formed as the undivided whole, and partial control of the thickness of the plated layer makes the production process complicated to thereby lower the productivity markedly. On this account, the gold plating thickness in the film carrier is determined in consideration of the bonding properties of the gold wire to the bonding pad (connecting terminal) and the fixing stability of the solder ball onto the ball pad, and the thickness of the gold plated layer is generally set in the range of about 0.3 to 0.5 μm. Considering the amount of the gold necessary for the wire bonding, by the formation of the gold plated layer having such a thickness, the gold wire should exhibit satisfactory bonding properties, but when actually measured, the bonding strength between the bonding pad (connecting terminal) and the gold wire is lower than expected.

It is thought that the reason why the above phenomenon occurs is that nickel which constitutes the undercoating layer and copper that is a conductive metal which constitutes the wiring pattern diffuse into the gold plated layer.

Such diffusion of nickel and copper can be prevented by providing an intermediate layer containing palladium as a main component between the nickel plated layer and the gold plated layer.

For example, an invention of a semiconductor device mounting tape carrier, which is obtained by forming a nickel plated layer on the surface of a bonding pad (connecting terminal), then plating palladium on the nickel plated layer and further forming a gold plated layer on the palladium plated layer, is disclosed in Japanese Patent Laid-Open Publication No. 303254/1998. Further, inventions of semiconductor device mounting tape carriers having a palladium layer formed under the gold plated layer are disclosed in Japanese Patent Laid-Open Publication No. 102939/1999 and Japanese Patent Laid-Open Publication No. 111782/1999.

In the semiconductor device mounting tape carriers disclosed in the above publications, the thickness of the palladium plated layer is about 0.05 to 0.2 μm, and in order to prevent diffusion of nickel and copper into the surface gold plated layer, the palladium plated layer of such thickness is effective. However, it has been found that when the palladium plated layer of such thickness is interposed as an intermediate layer, then a gold plated layer is formed on the intermediate layer and a gold wire is bonded to the gold plated layer by the use of a bonding tool, variability range of the peel strength of the gold wire thus bonded becomes large. That is to say, by the interposition of the palladium plated layer of the above thickness, diffusion of copper and nickel into the gold plated layer is effectively prevented, so that the peel strength of the bonded wire should become high naturally. However, the peel strength does not always become high, and besides the variability range of the peel strength tends to become large. The peel strength in the wire bonding using a gold wire is not less than 8 gf on an average, and the lower limit thereof is desirably not less than 8 gf. In the conventional film carriers, however, there is a fear of disconnection at the bonding pad (connecting terminal) having wide variability range of peel strength and low peel strength, even if the average peel strength in the wire bonding is not less than 8 gf.

When the gold wire bonded as above is forcedly peeled from the bonding pad (connecting terminal) to observe the peel surface, the peel surface is classified in any one of the following three peel states with regard totter wire bonding strength: (1) peel mode of A type (mode A): the bonding strength is higher than the strength of the gold wire bonded to the bonding pad (connecting terminal), so that the gold wire is broken while the bonded gold wire all remains on the surface of the bonding pad (connecting terminal); (2) peel mode of B type (mode B): the gold wire is broken while a part of the gold wire bonded to the bonding pad (connecting terminal) remains on the surface of the bonding pad (connecting terminal); and (3) peel mode of C type (mode C): most of the gold wire bonded to the bonding pad (connecting terminal) is peeled off on the interface of plated gold/gold, wire. The peel mode of A type is a mode which appears when very good bonding is carried out to unite the gold wire to the plated layer formed on the surface of the bonding pad (connecting terminal). In contrast therewith, the peel mode of C type is a mode which appears when the bonding strength between the gold plated layer on the surface of the bonding pad (connecting terminal) and the gold wire is low. In the wire bonding of electronic parts, it is desirable that the gold wire should be bonded in such a manner that the peel mode of A type appears at every bonding pad (connection terminal). However, it has been confirmed when a palladium layer of such a large thickness as described above is formed, the frequency of occurrence of the peel mode of A type tends to lower, and the peel mode of B type or C type tends to often appear.

Therefore, even if a palladium layer of large thickness is formed in accordance with the above-mentioned conventional technique, the variability range of the peel strength of the gold wire is increased, and the peel mode of B type or C type is liable to occur when the bonded wire is forcedly peeled. Further, if the wire bonding strength is increased, the variability range of the peel strength of the solder ball becomes large, and it is impossible to improve both of those properties at the same time by the conventional technique.

SUMMARY OF THE INVENTION

It is an object of the present invention to provide a film carrier tape for mounting electronic part having high wire bonding strength, narrow variability of the strength, high bonding reliability, and high connection stability of solder ball disposed on the ball pad.

The film carrier tape for mounting electronic part of the present invention is a film carrier tape comprising an insulating film and a wiring pattern which is made of a conductive metal and is provided on the surface of the insulating film, wherein:

an undercoating layer containing nickel as a main constituent is formed on at least a part of the surface of the wiring pattern made of a conductive metal, an intermediate layer containing palladium as a main constituent is formed on the surface of the undercoating layer, a surface layer containing gold as a main constituent is formed on the surface of the intermediate layer, and the average thickness of the intermediate layer containing palladium as a main constituent is not more than 0.04 $\mu$m.

In the film carrier tape for mounting electronic part of the present invention, an extremely thin palladium layer having an average thickness of not more than 0.04 $\mu$m is formed between the undercoating layer containing nickel as a main constituent and the surface layer containing gold as a main constituent. Hence, the bonding strength of the gold wire to the surface layer containing gold as a main constituent is enhanced, and the bonding strength is stabilized. By the arrangement of such a thin intermediate layer of palladium, further, the solder ball placed on the ball pad is rarely influenced by the gold plated layer containing gold as a main constituent, and hence the solder ball can be stably disposed.

BRIEF DESCRIPTION OF THE DRAWINGS

FIG. 4 is a group of schematic sectional views each of which shows a surface state of a bonding pad (connecting terminal) when a bonded gold wire is forcedly peeled.

DETAILED DESCRIPTION OF THE PREFERRED EMBODIMENTS

Figure 1:
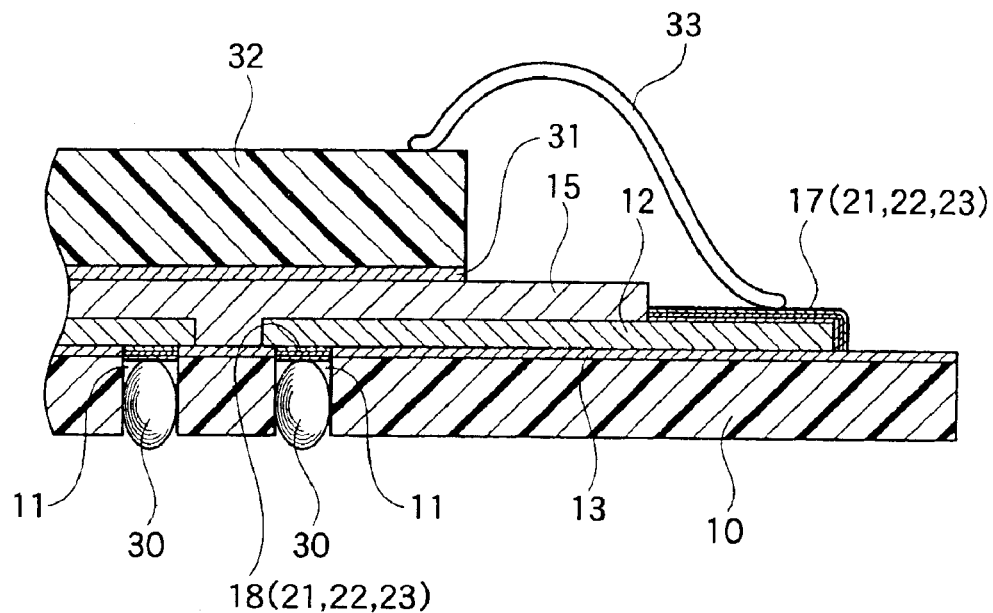
FIG. 1 is a sectional view of an embodiment of a film carrier tape for mounting electronic part of the present invention.

Referring to FIGS. 1 to 4, numeral 10 designates an insulating, film, numeral 11 designates a solder ball hole, numeral 12 designates a wiring pattern, numeral 13 designates an adhesive layer, numeral 15 designates a solder resist layer, numeral 17 designates a bonding pad (connecting terminal or inner terminal), numeral 18 designates a ball pad (outer terminal), numeral 21 designates an undercoating layer, numeral 22 designates an intermediate layer, numeral 23 designates a surface layer, numeral 30 designates a solder ball, numeral 31 designates an electronic part mounting adhesive, numeral 32 designates an electronic part, and numeral 33 designates a gold wire.

The film carrier tape for mounting electronic part of the present invention is described in detail hereinafter.

Figure 2:
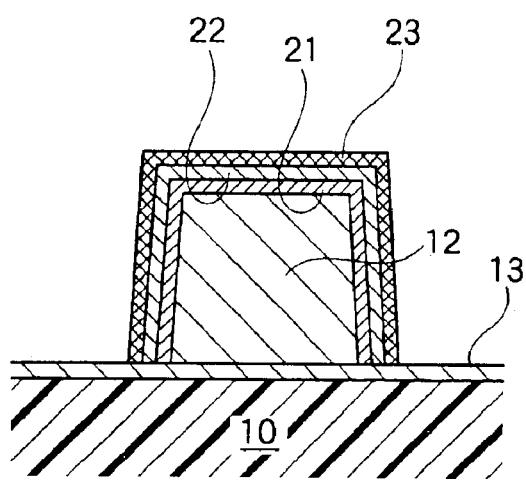
FIG. 2 is a sectional view of a bonding pad (connecting terminal) to which a gold wire is bonded by wire bonding.
Figure 3:
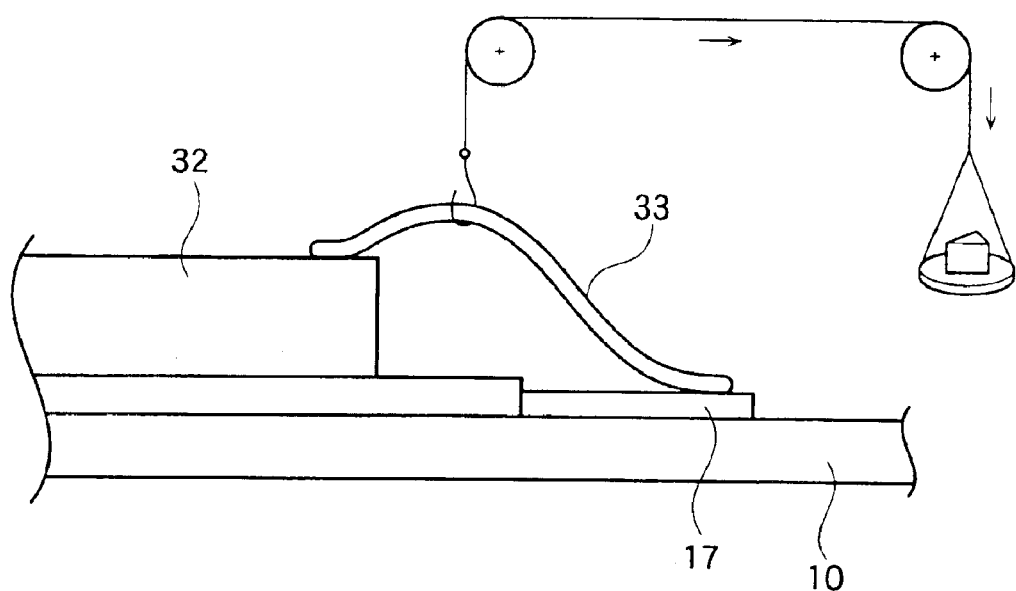
FIG. 3 is a schematic view showing a method for measuring bonding strength.

FIG. 1 is a sectional view of an embodiment of the film carrier tape for mounting electronic part of the present invention. FIG. 2 is a sectional view of a bonding pad (connecting terminator inner terminal) to which a gold wire is bonded by wire bonding. FIG. 3 is a schematic view showing a method for measuring bonding strength. FIG. 4 is a group of schematic sectional views each of which shows a surface state of a bonding pad (connecting terminal or inner terminal) when a bonded gold wire is forcedly peeled.

The film carrier tape for mounting electronic part of the present invention has a wiring pattern on the surface of an insulating film having flexibility.

As shown in FIG. 1, the insulating film 10 for constituting the film carrier tape for mounting an electronic part of the present invention is brought into contact with an acid or the like when subjected to etching and is heated when subjected to bonding, so that it has properties of being not damaged by such chemicals, namely, chemical resistance, and properties of being not deteriorated by such heat, namely, heat resistance. Examples of materials for forming the insulating film 110 include polyester, polyamide and polyimide. In the present invention, a film made of polyimide is preferably employed. The polyimide has prominent heat resistance as compared with other resins and is excellent also in the chemical resistance.

Examples of the polyimide resins include aromatic polyimides synthesized from pyromellitic acid dianhydride and aromatic diamines, and aromatic polyimides having biphenyl skeleton synthesized from biphenyltetracarboxylic acid dianhydride and aromatic diamines. In the present invention, the aromatic polyimides having biphenyl skeleton (e.g., Upilex S (trade name), available from Ube Industries, Ltd.) are particularly preferably employed. The aromatic polyimides having biphenyl skeleton have lower water absorption than that of the other aromatic polyimides. The thickness of the insulating film employable in the present invention is in the range of usually 25 to 125 $\mu$m, preferably 25 to 75 $\mu$m.

In the insulating film for constituting the film carrier tape for mounting an electronic part of the present invention, sprocket holes (perforations) are formed on its both side edges. Further, solder ball holes 11 where ball pads 18 are exposed, slits, alignment mark holes, etc. are formed.

In the film carrier tape for mounting an electronic part of the present invention, a wiring pattern 12 is provided on the surface of the above-mentioned insulating film 10. The wiring pattern 12 is generally formed by selectively etching a conductive metal foil disposed on the surface of the insulating film 10. For example, a conductive metal foil is stuck onto the surface of the insulating film 10 preferably through an adhesive layer 13, and on the conductive metal foil, a photosensitive resin layer is formed. Then, the photosensitive resin layer is subjected to light exposure and development to form a desired pattern, and the conductive metal is subjected to etching using the pattern as a masking material, whereby a desired wiring pattern 12 can be formed. Examples of the conductive metals employable herein include an aluminum foil and a copper foil, As the conductive metal foil, a metal foil having a thickness of usually 3 to 35 μm, preferably 9 to 25 μm, is employable.

Although the conductive metal foil is usually disposed on at least one surface of the insulating film, it may be disposed on both surfaces thereof.

In the present invention, it is preferable to use a copper foil as the conductive metal foil. Examples of the copper foils employable herein include an electrodeposited copper foil and a rolled copper foil. In consideration of the etching properties and the handling properties, it is preferable to use the electrodeposited copper foil.

After the wiring pattern is formed as described above, a solder resist is applied onto the wiring pattern except the bonding pad (connecting terminal) 17 which is to be electrically connected to the electronic part, and then the solder resist is cured by heating to form a solder resist layer 15.

On the surface of the bonding pad (connecting terminal or inner terminal) 17 exposed from the solder resist layer formed as above and on the surface of the ball pad (outer terminal) 18 exposed from the solder ball hole 11, an undercoating layer 21 containing nickel as a main constituent is formed. The undercoating layer 21 is a rigid layer composed of nickel or a nickel alloy, and this layer not only inhibits diffusion of copper which constitutes the wiring pattern 12 but also cuts off ultrasonic wave applied in the wire bonding. The thickness of the undercoating layer is in the range of usually 0.1 to 5 μm, preferably 0.2 to 2 μm. The undercoating layer 21 can be formed by depositing nickel or a nickel alloy through, for example, electroplating.

The film carrier tape for mounting electronic part of the present invention has an intermediate layer 22 containing palladium as a main constituent on the surface of the undercoating layer 21. The intermediate layer 22 is a layer containing palladium as a main constituent. In this layer, palladium is contained in an amount of not less than 50% by atom, and other metals, such as nickel, copper and gold, may be contained. The intermediate layer 22 containing palladium as a main constituent is not so thick as a palladium layer that is formed between a nickel layer and a gold layer in the conventional film carriers. The average thickness of the intermediate layer is not more than 0.04 μm, preferably 0.002 to 0.035 μm, particularly preferably 0.005 to 0.035 μm. The intermediate layer can be formed by depositing palladium or an alloy containing palladium as a main ingredient through, for example, electroplating.

The film carrier tape for mounting electronic part of the present invention has a surface layer 23 containing gold as a main constituent on the surface of the intermediate layer 22. The average thickness of the surface layer 23 is in the range of usually 0.1 to 2 μm, preferably 0.2 to 1 μm. The surface layer 23 is a layer containing gold as a main constituent. In this layer, gold is contained in an amount of not less than 50% by atom, and other metals, such as nickel, copper, palladium and cobalt, are sometimes contained. In the film carrier tape for mounting electronic part of the present invention, an extremely thin intermediate layer 22 containing palladium as a main constituent is disposed as described above, and by virtue of this intermediate layer 22 containing palladium as a main constituent, diffusion of nickel and copper is prevented. Therefore, the content of gold present on the surface of the surface layer 23 containing gold as a main constituent is usually not less than 93% by atom, preferably not less than 95% by atom, and the content of nickel present on the surface of the surface layer 23 is usually not more than 5% by atom, preferably not more than 4% by atom. The content of copper present on the surface of the surface layer 23 is usually not more than 3% by atom, preferably not more than 2% by atom. In the present invention, the content of metal present on the surface can be calculated from a value measured by the use of ESCA (X-ray photoelectron analyzing device). On the surface of the surface layer 23, nickel and copper are generally present as their oxides or hydroxides, and in the present invention, the content of such a metal present on the surface is expressed in % by atom in terms of the metal contained in those compounds.

The surface layer 23 can be formed by depositing gold through, for example, electroplating. In the film carrier tape for mounting electronic part of the present invention, gold plating can be carried out plural times to form the surface layer 23. Particularly in the present invention, in order to form the surface layer containing gold as a main constituent, it is preferable to conduct preplating of gold prior to main plating. In this case, the ratio of the thickness of the gold plated layer formed by preplating to the thickness of the gold plated layer formed by main plating is usually in the range of 1:10 to 1:200.

The average total thickness of the undercoating layer 21, the intermediate layer 22 and the surface layer 23 formed as above is in the range of usually 0.2 to 7 μm, preferably 0.4 to 3 μm.

In the present invention, further, the ratio of the average thickness of the intermediate layer 22 to the average thickness of the undercoating layer 21 (palladium:nickel) is preferably in the range of 1:2.5 to 1:2500.

In the present invention, furthermore, the ratio of the average thickness of the intermediate layer 22 to the average thickness of the surface layer 23 (palladium:gold) is preferably in the range of 1:2.5 to 1:1000, and the ratio of the average thickness of the surface layer containing gold as a main constituent to the average thickness to the undercoating layer containing nickel as a main constituent (gold:nickel) is preferably in the range of 1:0.05 to 1:50.

By setting the plated thickness ratios on the bonding pad (connecting terminal) and the ball pad of the film carrier tape for mounting electronic part of the present invention as described above, the peel mode by forcedly peeling the gold wire bonded to the bonding pad (connecting terminal) becomes a peel mode of A type (see FIG. 4), which takes place when the bonding strength is higher than the strength of the gold wire, and the peel mode of B type or C type, in which the gold wire is peeled off from the surface of the bonding pad (connecting terminal), does not occur. Thus, very good bonding properties to the gold wire appear, and additionally, the shear strength of the solder ball connected to the ball pad is also high.

In the film carrier tape for mounting electronic part of the present invention, an electronic part 32 is stuck and fixed on the surface of the solder resist layer 15 with an electronic part mounting adhesive 31, then the gold wire 33 is bonded to a terminal of the electronic part 32 through wire bonding, and the other end of the gold wire 33 is bonded to the bonding pad (connecting terminal) 17 through wire bonding, as shown in FIG. 1. In the wire bonding, a bonding tool (not shown) is employed. Thereafter, a solder ball 30 is placed in the solder ball hole 11 provided with the ball pad 18, to form a connecting section to the outside.

In the film carrier tape for mounting electronic part of the present invention, an extremely thin layer containing palladium as a main constituent is formed as the intermediate layer 22 as described above, whereby diffusion of copper and nickel into the surface layer 23 containing gold as a main constituent tan be inhibited to a certain extent, and besides, even if the surface layer 23 containing gold as a main constituent is thinly formed, very good wire bonding properties of the gold wire 33 to the bonding pad (connecting terminal) 17 can be obtained. That is to say, the average value of the wire bonding strength of the gold wire 33 is usually not less than 8 gf, preferably not less than 9 gf, and the variability range of the wire bonding strength in each lead is narrow and is usually not more than 1 gf, preferably not more than 0.6 gf. The wire bonding strength of the gold wire 33 is measured in the following manner. To the bonding pad (connecting terminal) 17 formed as above, the gold wire 33 having a diameter of 25 $\mu$m is bonded by wire bonding, then a hook is hung on the thus bonded gold wire 33 as shown in FIG. 3, and the wire bonding strength of the gold wire 33 is measured with pulling up the gold wire 33. In the film carrier tape for mounting electronic part of the present invention, the minimum value of the wire bonding strength of the gold wire 33 can be increased to not less than 8 gf, preferably not less than 8.5 gf.

When the gold wire 33 bonded to the bonding pad (connecting terminal) 17 is forcedly peeled, the surface of the bonding pad (connecting terminal) becomes in such a state as shown in FIG. 4. The peel mode of A type (mode A) shown in FIG. 4 is a mode observed in the case that the bonding strength is higher than the strength of gold wire 33, and in this mode, the gold wire 33 is so firmly bonded to the undercoating layer 21, the intermediate layer 22 and the surface layer 23 that even if an attempt to peel off the gold wire 33 is made, the gold wire 33 is broken while all portion of the gold wire 33 bonded to the surface of the bonding pad (connecting terminal) 17 remains on the surface of the bonding pad (connecting terminal) 17. The peel strength necessary for such a peel state of the gold wire 33 is usually in the range of 10.0 gf±1.0 gf, and this means that the bonding strength of the gold wire 33 to the bonding pad (connecting terminal) is higher than the strength of the gold wire 33 itself.

The peel mode of B type (mode B) is a mode wherein, by the forced peeling of the gold wire 33, the gold wire 33 is broken while about a half of the gold wire 33 bonded to the surface of the bonding pad (connecting terminal) is peeled off but about the other half remains on the surface of the bonding pad (connecting terminal). The peel strength necessary for such a peel state of the gold wire 33 is usually in the range of 7.7 gf±1.4 gf, and this means that the bonding strength of the gold wire 33 to the bonding pad (connecting terminal) is lower than that of the mode A.

In the peel mode of C type (mode C), the bonding strength between the gold wire 33 and the surface layer 23 containing gold as a main constituent is much lower, though the gold wire is bonded to the bonding pad (connecting terminal), and by the forced peeling of the gold wire 33, most of the gold wire 33 is peeled off from the bonding pad (connecting terminal), that is, only a part of the gold wire sometimes remains on the surface layer 23, but most of the gold wire 33 bonded to the bonding pad (connecting terminal) is peeled off. The bonding strength of the gold wire 33 to the bonding pad (connecting terminal) is usually in the range of 4.3 gf±1.5 gf, and is much lower than that of the peel mode of B type.

In the film carrier tape for mounting electronic part of the present invention, owing to the above-mentioned constitution of the plated layers formed on the surface of the bonding pad (connecting terminal) 17, a state of the cross section of the bonding pad (connecting terminal) 17 when the gold wire 33 is forcedly peeled always becomes in a state of the peel mode of A type and never becomes in a state of the peel mode of B type or C type.

The above-mentioned peel state (mode A) in the forced peeling can be attained by the formation of an extremely thin intermediate layer 22, and does not depend upon the gold content in the surface layer 23 containing gold as a main constituent so much. In the film carrier tape for mounting electronic part of the present invention, therefore, the thickness of the surface layer 23 containing gold as a main constituent can be reduced. Even if the thickness of the surface layer 23 is reduced, the wire bonding properties of the gold wire 33 are not lowered, and additionally, by reducing the thickness of the surface layer 23, the adhesion properties of the solder ball 30 disposed on the ball pad 18 to the surface of the ball pad 18 can be enhanced. In order to stick the solder ball 30 to the surface of the ball pad 18, the amount of gold present on the surface of the ball pad is preferably small, but it is very difficult to locally change the plating thickness by the plating technique. In the film carrier tape for mounting electronic part of the present invention, however, by virtue of the formation of such an extremely thin intermediate layer 22 containing palladium as a main constituent, the wire bonding strength of the gold wire 33 is not lowered even if the surface layer 23 is thin. Moreover, as the thickness of the surface layer 23 containing gold as a main constituent becomes reduced, the adhesion properties of the solder ball 30 to the surface of the ball pad 18 is more enhanced. As a result, the average peel strength of the solder ball becomes usually not less than 400 gf, preferably not less than 450 gf, and the variability range of the peel strength becomes usually not more than ±30 gf, preferably not more than ±25 gf. That is to say, according to the film carrier tape of the present invention, the peel strength of the solder ball can be made uniform as a whole.

In order to obtain a good balance between the wire bonding properties on the surface of the bonding pad (connecting terminal) 17 and the adhesion properties of the solder ball 30 to the ball pad 18, the thickness of the intermediate layer 22 containing palladium as a main constituent needs to be extremely reduced, i.e., not more than 0.04 $\mu$m, as adopted in the present invention. For stably keeping adhesion strength of the solder ball 30 to the ball pad 18 with high values, it is very advantageous to set the thickness of the intermediate layer containing palladium as a main constituent in the aforesaid range and to thinly form the surface layer 23 containing gold as a main constituent.

In the film carrier tape for mounting electronic part of the present invention, the intermediate layer 22 containing palladium as a main constituent and having an average thickness of not more than 0.04 $\mu$m is provided between the undercoating layer 21 containing nickel as a main constituent and the surface layer 23 containing gold as a main constituent. By providing such a thin intermediate layer containing palladium as a main constituent, the wire bonding properties are not lowered even if the thickness of the surface layer 23 is reduced to about ½ of the conventional film carrier tapes, and besides, the surface layer 23 formed on the surface of the ball pad 18 can be also made thin. According to the present invention, formation of the intermediate layer 22 of the aforesaid thickness containing palladium as a main constituent makes it possible to hold the solder ball on the surface of the ball pad 18 with a high strength, without deteriorating wire bonding properties on the surface of the bonding pad (connecting terminal) 17.

Further, since the surface layer 23 can be formed thinly, the amount of gold that is an expensive material for forming a film carrier can be decreased, and as a result, an inexpensive and high-reliability film carrier tape can be provided.

In the film carrier tape for mounting electronic part of the present invention, the occupied area of the electronic part mounted and the occupied area to dispose the solder ball that is an outer connecting section are almost equal as in the CSP, COF, BGA, TAB or the like, so that the film carrier tape of the present invention is very useful as a film carrier tape for mounting electronic part of such a type that a bump of an electronic part and a bonding pad (connecting terminal) are connected by wire bonding.

The constitution of the present invention is very effective not only for the CSP, COF, BGA and TAB but also for film carrier tapes and multi-layer laminates, which have a layer structure having an undercoating layer mainly composed of nickel on the surface of a wiring pattern made of a conductive metal foil, having an intermediate layer mainly composed of palladium on the surface of the undercoating layer, and having a surface layer mainly composed of gold on the surface of the intermediate layer.

The film carrier tape for mounting electronic part of the present invention has an undercoating layer containing nickel as a main constituent on the surfaces of a bonding pad (connection terminal) and a ball pad each of which is made of a conductive metal, has an intermediate layer of specific thickness containing palladium as a main constituent on the undercoating layer, and has a surface layer containing gold as a main constituent on the surface of the intermediate layer. On the surface of the bonding pad (connecting terminal), in order to enhance the wire bonding properties to the gold wire, the surface layer is preferably made thick to increase the amount of gold to be subjected to the wire bonding. On the other hand, on the surface of the ball pad, a solder ball needs to be disposed, and in order to ensure good adhesion properties of the solder ball to the ball pad, the thickness of the gold plated layer as the surface layer formed on the ball pad is preferably reduced. Thus, the metal necessary for the surface of the bonding pad (connecting terminal) and the metal necessary for disposing the solder ball on the ball pad are incompatible with each other. In the present invention, the thickness of the intermediate layer containing palladium as a main constituent is decreased to not more than 0.04 μm, and thereby the adhesion properties of the solder ball to the ball pad is enhanced without deteriorating the wire bonding properties on the bonding pad (connecting terminal).

Further, since such a thin intermediate layer containing palladium as a main constituent is provided and the surface layer is formed thereon, the variability range of the wire bonding properties of the gold wire to the bonding pad (connecting terminal) and the variability range of the peel properties of the solder ball disposed on the surface of the ball pad become small, and hence the film carrier tape for mounting electronic part of the present invention has extremely high reliability.

Moreover, since the thickness of the surface layer is reduced to decrease the amount of gold used, the economical effect in the production of the film carrier tape is also great.

EXAMPLES

The present invention is further described with reference to the following examples, but it should be construed that the invention is in no way limited to those examples.

Example 1

Comparative Example 1

A polyimide film (available from Ube industries, Ltd., Upilex S) having a thickness of 50 μm was punched to form sprocket holes, solder ball holes, etc., and then to the film was laminated an electrodeposited copper foil having an average thickness of 25 μm by application of heat and pressure. Thereafter, the surface of the copper foil was coated with a photoresist. The resulting photoresist layer was subjected to light exposure and development in the conventional manner to form a desired pattern. Then, etching was carried out to form a desired wiring pattern.

The wiring pattern thus formed was coated with a solder resist, except the lead sections, and the solder resist was thermally cured.

Then, the lead (bonding pad (connecting terminal)) sections exposed from the solder resist layer formed as above and the ball pad sections exposed from the solder ball holes were subjected to acid washing to perform degreasing. Then, nickel plating was carried out on the surfaces of the bonding pads and the ball pads under the following conditions.

Plating bath: nickel sulfamate bath
Current density: 1.3 A/dm$^2$
Preset plating thickness: 0.35 μm On the surface of the nickel plated layer formed as above, a palladium plated layer was formed under the following conditions. In Comparative Example 1, the palladium plated layer was not formed.

Plating bath: Pd-452 (available from Ferro Japan)
Current density: 1.0 A/dm$^2$
Preset plating thickness: 0.004 μm Then, on the surface of the palladium plated layer formed as above, a gold plated layer was formed under the following conditions in such a manner that the total preset plating thickness became 0.35 μm.

Gold preplating bath: Aurobond TN (available from Electroplating Engineers of Japan Ltd.)
Current density: 0.9 A/dm$^2$
Preset plating thickness: 0.01 μm
Gold main plating bath: Tem perex #8400 (available from Electroplating Engineers of Japan Ltd.)
Current density: 0.4 A/dm$^2$
Preset plating thickness: 0.35 μm The film carrier tape having the plated layers formed as above was heated at 190° C. for 3 minutes to remove warpage and then further heated at 150° C. for 2 hours to perform wire bonding pretreatment.

The bonding pad (connecting terminal) thus formed was subjected to surface analysis by the use of ESCA (X-ray photoelectron analyzing device). The results are set forth in Table 1.

TABLE 1

|  | Gold content | Nickel content | Copper content |
| --- | --- | --- | --- |
| Ex. 1 | 95.35 atomic % | 2.90 atomic % | 1.75 atomic % |
| Comp. Ex. 1 | 92.67 atomic % | 6.04 atomic % | 1.29 atomic % |

Then, IC was stuck onto the solder resist layer of the film carrier tape. Then, as shown in FIG. 2, a gold wire having a diameter of 25 μm was heated to 160° C. with applying ultrasonic wave of 600 mW to electrically connect the electrode of IC to the bonding pad (connecting terminal) by wire bonding.

On the gold wire thus bonded by the wire bonding, a hook was hung to measure wire bonding strength, as shown in FIG. 3. The results are set forth in Table 2.

Then, to the solder ball holes formed on the polyimide film, eutectic solder balls having an average diameter of 330 μm were provided, and by the use of a paste typed flux WS613-M3 (available from Alpha Metals Japan Ltd.) as a flux, ball connection was carried out under the conditions of a peak temperature of 200 to 210° C., a 183° C. or higher heating time of 30 to 40 seconds, a preheating temperature of 155 to 175° C. and a preheating time of 40 to 80 seconds, to prepare a film carrier tape for mounting electronic part.

Further, the peel strength of the solder balls on the film carrier tape was measured under the conditions of a test height of 5.0 μm and a test speed of 80 μm/sec. The results are set forth in Table 2.

In the following table, the standard deviation shows variability ranges of wire bonding strength and solder ball peel strength.

TABLE 2

| | Ex. 1<br>Gold plating thickness:<br>0.35 μm<br>Palladium plating thickness:<br>0.004 μm<br>Nickel plating thickness:<br>0.35 μm | | Comp. Ex. 1<br>Gold plating thickness:<br>0.35 μm<br>Palladium plating thickness:<br>0 μm<br>Nickel plating thickness:<br>0.35 μm | |
|---|---|---|---|---|
| | Wire bonding strength | Solder ball peel strength | Wire bonding strength | Solder ball peel strength |
| Average value | 9.6 gf | 500.7 gf | 8.5 gf | 504.2 gf |
| Maximum value | — | 539.7 gf | — | 541.3 gf |
| Minimum value | — | 472.0 gf | — | 474.8 gf |
| Standard deviation | 0.5 gf | 21.6 gf | 2.0 gf | 24.3 gf |

The gold wire bonded to the bonding pad (connecting terminal) by wire bonding in each of Example 1 and Comparative Example 1 was forcedly peeled to observe the surface of the bonding pad (connecting terminal). As a result, in Example 1, peel of mode A took place in a proportion of 100% (number of bonding pads), and peel of mode B or mode C did not take place, while in Comparative Example 1, peel of mode A took place in a proportion of 40%, peel of mode B took place in a proportion of 30%, and peel of mode C took place in a proportion of 30%.

In the film carrier tape, the peel of mode A took place when the bonded wire having an average bonding strength of 10.1 gf and a variability range (standard deviation) of 1.0 gf was peeled, the peel of mode B took place when the bonded wire having an average bonding strength of 7.7 gf and a variability range (standard deviation) of 1.3 gf was peeled, and the peel of mode C took place when the bonded wire having an average bonding strength of 4.3 gf and a variability range (standard deviation) of 1.5 gf was peeled.

Example 2

A film carrier tape was prepared in the same manner as in Example 1, except that the thickness of the palladium plated layer was changed to 0.002 μm and the thickness of the gold plated layer was changed to 0.50 μm. Then, various properties of the film carrier tape were measured in the same manner as in Example 1.

The results are set forth in Table 3.

Comparative Example 2

A film carrier tape was prepared in the same manner as in Example 2, except that the palladium plated layer was not formed. Then, various properties of the film carrier tape were measured in the same manner as in Example 1.

The results are set forth in Table 3.

TABLE 3

| | Ex. 2<br>Gold plating thickness:<br>0.50 μm<br>Palladium plating thickness:<br>0.002 μm<br>Nickel plating thickness:<br>0.35 μm | | Comp. Ex. 2<br>Gold plating thickness:<br>0.50 μm<br>Palladium plating thickness:<br>0 μm<br>Nickel plating thickness:<br>0.35 μm | |
|---|---|---|---|---|
| | Wire bonding strength | Solder ball peel strength | Wire bonding strength | Solder ball peel strength |
| Average value | 9.9 gf | 482.5 gf | 9.0 gf | 483.2 gf |
| Maximum value | — | 504.8 gf | — | 520.7 gf |
| Minimum value | — | 459.5 gf | — | 440.3 gf |
| Standard deviation | 0.5 gf | 17.7 gf | 0.8 gf | 32.8 gf |

Example 3

A film carrier tape was prepared in the same manner as in Example 1, except that the thickness of the palladium plated layer was changed to 0.01 μm and the thickness of the gold plated layer was changed to 0.50 μm. Then, various properties of the film carrier tape were measured in the same manner as in Example 1.

The results are set forth in Table 4.

Comparative Example 3

A film carrier tape was prepared in the same manner as in Example 3, except that the palladium plated layer was not formed. Then, various properties of the film carrier tape were measured in the same manner as in Example 1.

The results are set forth in Table 4.

TABLE 4

| | Ex. 3<br>Gold plating thickness:<br>0.50 μm<br>Palladium plating thickness:<br>0.01 μm<br>Nickel plating thickness:<br>0.35 μm | | Comp. Ex. 3<br>Gold plating thickness:<br>0.50 μm<br>Palladium plating thickness:<br>0 μm<br>Nickel plating thickness:<br>0.35 μm | |
|---|---|---|---|---|
| | Wire bonding strength | Solder ball peel strength | Wire bonding strength | Solder ball peel strength |
| Average value | 9.9 gf | 481.9 gf | 9.0 gf | 483.2 gf |
| Maximum value | — | 502.9 gf | — | 520.7 gf |
| Minimum value | — | 447.8 gf | — | 440.3 gf |
| Standard deviation | 0.3 gf | 18.7 gf | 0.8 gf | 32.8 gf |

What is claimed is:

1. A film carrier tape for mounting an electronic part comprising an insulating film and a wiring pattern which is made of a conductive metal and is provided on a surface of the insulating film, wherein:

an undercoating layer containing nickel as a main constituent is formed on at least a part of a surface of the wiring pattern made of a conductive metal, an intermediate layer containing palladium as a main constituent is formed on a surface of the undercoating layer, a surface layer containing gold as a main constituent is formed on a surface of the intermediate layer, and an average thickness of the intermediate layer containing palladium as a main constituent is not more than about 0.04 µm.

2. The film carrier tape for mounting an electronic part as claimed in claim 1, wherein a ratio of the average thickness of the intermediate layer containing palladium as a main constituent to an average thickness of the surface layer containing gold as a main constituent (palladium:gold) is in the range of about 1:2.5 to about 1:1000.

3. The film carrier tape for mounting an electronic part as claimed in claim 1, wherein a ratio of the average thickness of the intermediate layer containing palladium as a main constituent to an average thickness of the undercoating layer containing nickel as a main constituent (palladium:nickel) is in the range of about 1:2.5 to about 1:2500.

4. The film carrier tape for mounting an electronic part as claimed in claim 1, wherein a ratio of the average thickness of the surface layer containing gold as a main constituent to an average thickness of the undercoating layer containing nickel as a main constituent (gold:nickel) is in the range of about 1:0.05 to about 1:50.

5. The film carrier tape for mounting an electronic part as claimed in claim 1, wherein a surface of the surface layer containing gold as a main constituent has a gold content of not less than about 93% by atom and has a nickel content of not more than about 5% by atom.

6. The film carrier tape for mounting an electronic part as claimed in claim 1, wherein a surface of the surface layer containing gold as a main constituent has a copper content of not more than about 3% by atom.

7. The film carrier tape for mounting an electronic part as claimed in claim 1, wherein the undercoating layer containing nickel as a main constituent, the intermediate layer containing palladium as a main constituent and the surface layer containing gold as a main constituent are formed at an inner terminal of the wiring pattern electrically connected to at least one of the electronic part and an outer terminal of the film carrier.

8. The film carrier tape for mounting an electronic part as claimed in claim 1, wherein the wiring pattern made of a conductive metal is formed from at least one of copper and a copper alloy.

* * * * *

UNITED STATES PATENT AND TRADEMARK OFFICE
CERTIFICATE OF CORRECTION

PATENT NO. : 6,891,198 B2  Page 1 of 1
DATED : May 10, 2005
INVENTOR(S) : Matsumura et al.

It is certified that error appears in the above-identified patent and that said Letters Patent is hereby corrected as shown below:

<u>Title page,</u>
Item [57], ABSTRACT,
Line 8, "of he undercoating" should read -- of the undercoating --.

Signed and Sealed this

First Day of November, 2005

JON W. DUDAS
*Director of the United States Patent and Trademark Office*